Oct. 10, 1972 R. A. STEHLIN 3,697,337

PROCESS FOR FABRICATING A MONOLITHIC CIRCUIT WITH HIGH Q CAPACITOR

Original Filed June 30, 1967 3 Sheets-Sheet 1

United States Patent Office 3,697,337
Patented Oct. 10, 1972

3,697,337

PROCESS FOR FABRICATING A MONOLITHIC CIRCUIT WITH HIGH Q CAPACITOR

Robert A. Stehlin, Richardson, Tex., assignor to Texas Instruments Incorporated, Dallas, Tex.

Original application June 30, 1967, Ser. No. 650,496, now Patent No. 3,474,309, dated Oct. 21, 1969. Divided and this application Feb. 5, 1969, Ser. No. 810,436
Int. Cl. H01l 7/36, 19/00
U.S. Cl. 148—175 6 Claims

ABSTRACT OF THE DISCLOSURE

A process for fabricating a monolithic circuit having both matched complementary PNP and NPN transistors and double junction capacitors having a high Q value. Insolated n-type regions for each transistor and the capacitor are formed by diffusing p-type isolation rings through an n-type epitaxial layer into a p-type substrate. Separate diffusions are then made for the collector, base and emitter of the PNP transistor and for the base and emitter of the NPN transistor. The capacitor is formed by the same diffusions that form the collector region of the PNP transistor and the diffusion that forms the emitter of the NPN transistor. The collector diffusion for the PNP transistor is relatively deep and the emitter diffusion for the NPN transistor is relatively shallow, thus providing a low resistivity charging path through the p-type region to the opposed junctions forming the capacitor.

The invention described herein was made in the performance of work under a NASA contract and is subject to the provisions of Section 305 of the National Aeronautics and Space Act of 1958, Public Law 85–568 (72 Stat 435; 42USC2457).

This application is a division of application Ser. No. 650,496, filed June 30, 1967, now U.S. Letters Patent No. 3,474,309, issued Oct. 21, 1969.

This invention relates generally to semiconductor devices, and more particularly relates to the fabrication of monolithic silicon circuits having complementary PNP and NPN transistors and capacitors.

It has become common practice to fabricate complete functional circuits in monolithic form. Such circuits are generally referred to as integrated circuits and may have both NPN and PNP transistors, diodes, capacitors, and resistors all formed on the same semiconductor substrate by various combinations of the same diffusion steps. Since yield tends to decrease exponentially with an increase in the number of diffusion steps in any particular fabrication process, it is virtually essential to fabricate the passive components with the same diffusion steps required to form the active components. If an integrated circuit uses only one type of transistor, only three diffusions are typically used. If both NPN and PNP transistors are required for the circuit, it is generally necessary to make at least four diffusions, and a number of processes have been devised which utilize an even larger number of diffusion steps, particularly when the NPN and PNP transistors must have matched operational parameters.

Diffused capacitors for monolithic circuits are formed merely by reverse biasing a PN junction. The area required for a particular capacitance value is typically reduced by about fifty percent by using the two junctions of a conventional transistor since it is necessary only to short the collector and emitter regions to form the two outside "plates" of a three "plate" capacitor. The base region then forms the center "plate." However, the base region of a transistor must be quite narrow for optimum transistor operation, which results in a relatively high sheet resistance, typically 7000 or 8000 ohms per square. Since the capacitor must be charged through this series resistance, the charging rate of such a capacitor is relatively slow and the capacitor has a relatively low Q value. The value Q is defined as the energy stored divided by the energy dissipated, and is expressed more accurately by the following equation:

$$Q=wC\left[\frac{R_D}{\left(\frac{R_s}{R_D}\right)+1+w^2C^2R_DR_s}\right] \quad (1)$$

where $w$ is the frequency, C is the capacitance, $R_D$ is the leakage current of the reverse biased junction, and $R_s$ is the series resistance in the charging path. Thus, it will be noted that the Q value can be increased substntially by reducing the value of $R_s$, which is primarily related to the sheet resistance of the base region in the conventional diffused capacitor.

This invention is concerned with the process for fabricating a monolithic circuit having a PNP transistor, an NPN transistor, and a double junction capacitor wherein one junction of the capacitor is formed by the same p-type diffusion step used to form the collection region of the PNP transistor, and the second junction of the capacitor is formed by the same n-type diffusion step used to form the emitter region of the NPN transistor. As a result, the p-type diffused region forming the middle "plate" is much thicker than a conventional diffused capacitor of a monolithic circuit and therefore has a much higher Q value and a lower time constant.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
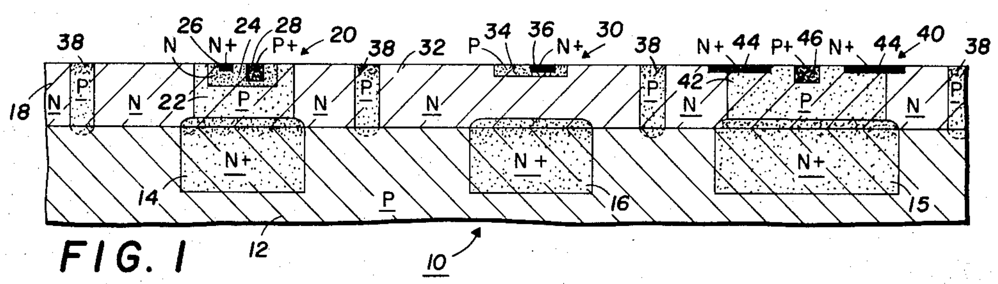
FIG. 1 is a schematic sectional view illustrating a monolithic circuit constructed in accordance with the present invention.

Referring now to the drawings, an integrated circuit constructed in accordance with the present invention is indicated generally by the reference numeral 10 in FIG. 1. The integrated circuit 10 has a p-type silicon substrate 12 having heavily doped n-type diffused regions 14, 15 and 16. A PNP transistor, indicated generally by the reference numeral 20, is formed by a diffused collector region 22, a diffused base region 24 having a diffused base contact 26, and a diffused emitter region 28. An NPN transistor, indicated generally by the reference numeral 30, has a collector region 32 formed by a portion of the epitaxial layer 18, a base region formed by diffused region 34, and an emitter region formed by diffused region 36.

A double junction capacitor, indicated generally by the reference numeral 40, is formed by the junction between a diffused p-type region 42 and the buried n-type region 15, and by the junction formed between diffused p-type region 42 and diffused n-type region 44. A diffused p-type region 46 provides a low resistivity contact to the more lightly doped diffused p-type region 42, and permits ohmic contact between an overlying metal contact (not illustrated) and the semiconductor contact.

The transistors 20 and 30 and the capacitor 40 are isolated one from the other, and from other components in the circuit, by isolation rings formed by p-type diffusions 38 which extend through the epitaxial layer into the substrate 18. Although not illustrated, it will be appreciated that the isolation rings 38 extend completely around each of the components. The buried n-type region 14 isolates the collector region 22 of the PNP transistor from the substrate 12. The buried diffused region 16 provides a low resistance path for collector current to the NPN transistor 30.

Figure 2:
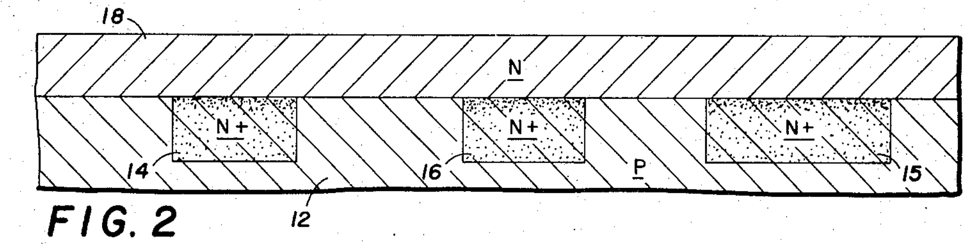
FIGS. 2–6 are schematic sectional views similar to FIG. 1 illustrating successive steps in a process in accordance with the present invention for fabricating the monolithic circuit of FIG. 1.

The integrated circuit 10 may be fabricated in accordance with the following process. The starting material is illustrated in FIG. 2 and is a p-type silicon substrate 12 having a resistivity of 10–15 ohm-centimeters and a typical thickness of 0.010 inch. The diffused regions 14, 15, and 16 are doped with antimony and have a surface concentration of about $1\times10^{18}$ atoms/cc., a resistivity of about 0.02 ohm-centimeters, and a depth of about ten microns. The epitaxial layer 18 which overlies the substrate 12 and the diffused regions 14, 15, and 16 is also n-type silicon doped with antimony, has a resistivity of about 0.2 ohm-centimeters and is about ten microns thick.

Figure 3:
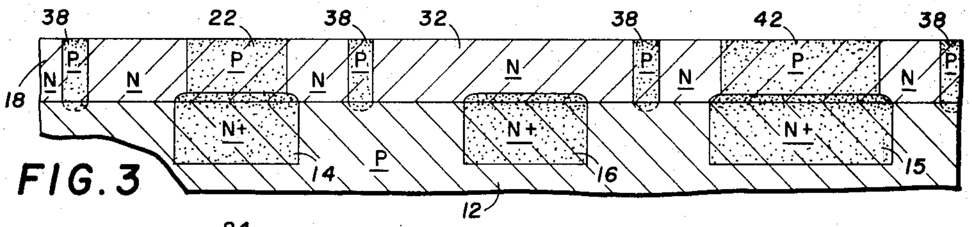
Figure 4:
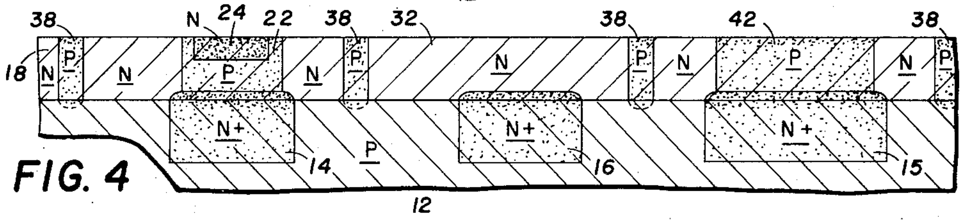
Figure 5:
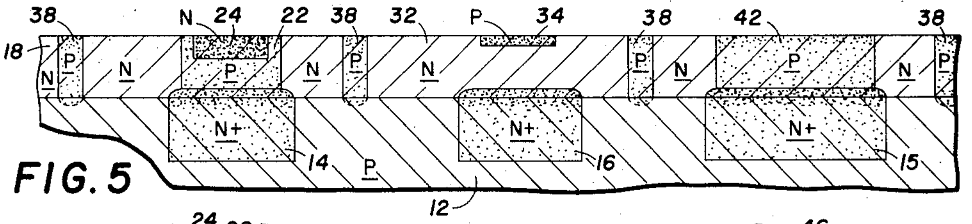
Figure 6:
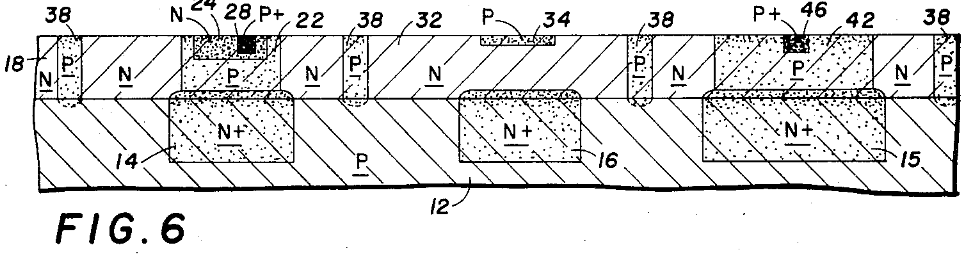

The first step of the process is a p-type diffusion to form the collector region 22 of the PNP transistor 20, the diffused region 42 of the capacitor 40, and the isolation rings 38, substantially as illustrated in FIG. 3. The diffusion is made by first placing the substrate in a deposition furnace, heating the substrate to about 975° C., purging the deposition chamber with nitrogen for about five minutes, passing a conventional reactant stream containing boron tribromide ($BBr_3$) through the deposition chamber for about twenty minutes, and then purging the chamber with nitrogen for another five minutes. The substrate is then subjected to a conventional deglaze step and placed in a diffusion furnace where it is heated to about 1200° C. While the diffusion furnace is first purged with oxygen for about five minutes, then filled with steam for about thirty minutes, then purged with nitrogen for about five minutes. The temperature of the substrate is then raised to about 1250° C. for about eight hours using an oxygen atmosphere.

The impurity concentration at the surface resulting from the p-type diffusion is about $2\times10^{18}$ atoms/cc. The p-type collector region 22 and the diffused region 42 of the capacitor form junctions with the underlying heavily doped n-type regions 14 and 15, respectively, at a depth of about 8.5 microns as a result of the diffusion of the antimony upwardly from the diffused regions 14 and 15. The p-type region 38 forming the isolation rings, however, extends downwardly to a depth of about 11.5 microns, is well into the p-type substrate 12. The resulting sheet resistance of the collector region is about 70 ohms per square.

The next step is to diffuse the base region 24 of the PNP transistor. The surface concentration of the diffused n-type region 24 is kept as low as possible and still achieve the desired depth for the collector-base junction. Phosphorus is used as the n-type dopant and is deposited from phosphorus oxytrichloride ($POCl_3$) at a substrate temperature of about 800° C. The deposition period is about twenty-five minutes, preceded and followed by five minute nitrogen purges. After a deglazing step, the sheet resistance is about 150–160 ohms per square. The phosphorus introduced is then diffused at 1200° C. using a ten minute nitrogen purge, followed by twenty minutes in a steam atmosphere and sixty minutes in an oxygen atmosphere. At this point, the sheet resistance is about 50 ohms per square and the depth of the diffusion is about 1.6 microns and the surface concentration of the diffused region 24 is about $1\times10^{19}$.

Next, the base region 34 of the NPN transistor 30 is diffused. Boron is again used as the doping impurity and is deposited from a boron tribromide ($BBr_3$) source. The depositon is carried out at a substrate temperature of about 900° C. for a period of about twenty minutes, preceded and followed by five minute purge periods. After a deglazing step, the sheet resistance is about 100–105 ohms per square. The boron is then diffused at about 1050° C., using a ten minute prepurge followed by twenty-five minutes in a steam atmosphere and twenty minutes in an oxygen atmosphere. The impurity concentration at the surface is about $5\times10^{18}$ atoms/cc. The final sheet resistance of diffusion 34 is about 550 ohms per square and has a depth of 0.96 micron.

Next, the emitter region 28 of the PNP transistor and the contact region 46 of the capacitor 40 are formed. This is again a boron deposition from boron tribromide and may be carried out at a substrate temperature of about 1100° C. for a period of about eight minutes, preceded and followed by two minute purge periods. The impurity concentration at the surface is about $4\times10^{20}$ atoms/cc., and the junction depth is about 1.1 microns.

Since no oxide layer is grown during the low temperature diffusion of the emitter region 28, the substrate is then covered with a layer of oxide deposited by the thermal decomposition of tetraethyl orthosilane to cover the windows through which the emitter diffusion 28 was made.

Finally, the emitter region 36 of the NPN transistor, the base contact region 26 of the PNP transistor, and the region 44 of the capacitor 40 are diffused. The deposition and diffusion are made from phosphorus oxytrichloride ($POCl_3$) at a substrate temperature of about 1000°. C. for eight minutes, preceded and followed by two minute purge periods. The surface concentration of the final diffusion is about $1\times10^{21}$ atoms/cc., and the diffusion depth is about 0.5 micron.

The capacitor 40 resulting from the process has a high Q value and a shorter time constant than conventional diffused capacitors. The diffused region 42 has a much greater thickness, about eight microns, than the base region of a transistor and therefore has a much lower sheet resistance. Therefore, for a given area, the series resistance value $R_s$ of the capacitor is much less than for a conventional capacitor of the same area. In addition, the lower junction between the heavily doped n-type region 15 and the diffused p-type region 42 provides more capacitance than is normally provided by the collector-base junction of a transistor.

Figure 7:
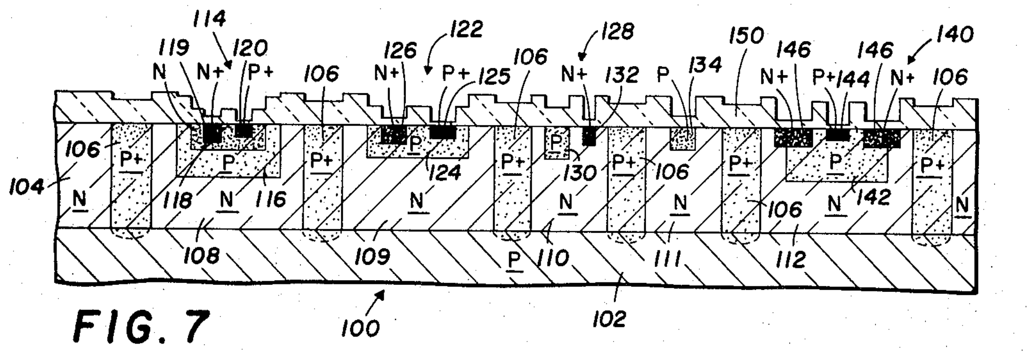
FIG. 7 is a schematic sectional view illustrating another monolithic circuit constructed in accordance with the present invention.

Referring now to FIG. 7, another monolithic circuit constructed in accordance with the present invention is indicated generally by the reference numeral 100. The monolithic circuit 100 is comprised of a p-type silicon substrate 102 and an epitaxially formed n-type layer 104 which extends over the entire surface of the substrate. Heavily doped p-type diffused regions 106 extend through the epitaxial layer 104 to the p-type substrate 102 and form a plurality of isolation rings dividing the n-type epitaxial layer into a plurality of electrically isolated pockets 108, 109, 110, 111, and 112.

A PNP transistor, indicated generally by the reference numeral 114, is formed by a p-type diffused collector region 116, an n-type diffused base region 118 having a heavily doped n-type contact 119, and a p-type diffused emitter region 120.

The isolated pocket 109 of the n-type epitaxial layer 104 forms the collector region of an NPN transistor indicated generally by the reference numeral 122, a p-type diffused region 124 having a heavily doped p-type contact region 125 forms the base, and an n-type diffused region 126 forms the emitter.

A diode, indicated generally by the reference numeral 128, is formed by the isolated pocket 110 of the n-type epitaxial layer 104 and a p-type diffused region 130. A heavily doped n-type diffused region 132 provides ohmic contact with the n-type region 110.

A resistor 134 is formed by a p-type diffusion in the isolated pocket 111 of the n-type epitaxial layer 104.

A capacitor, indicated generally by the reference numeral 140, is formed by the isolated region 112 of the epitaxial layer 104, a p-type diffused region 142 having a heavily doped contact 144, and a heavily doped n-type region 146.

In FIG. 7, the oxide layer used as a diffusion mask during the fabrication of the circuit is indicated generally by the reference numeral 150 and is illustrated generally as it exists prior to the time that the openings are cut in the oxide and the metallized film deposited and patterned to form the contacts to the various components.

The monolithic circuit 100 is fabricated in accordance with the present invention by the process illustrated in FIGS. 8–13. The starting material is a p-type silicon substrate 102 having a resistivity of 10–15 ohm-centimeters, An epitaxially grown layer of silicon 104 about eighteen microns thick extends over the entire surface of the substrate 102 and has a resistivity of about 0.2 ohm-centimeters.

All diffusion steps presently to be described employ conventional diffusion techniques in that silicon dioxide is used as a diffusion mask and is patterned using conventional photolithographic techniques. Silicon dioxides for each succeeding diffusion step is grown during the preceding diffusion step. Accordingly, the masking process associated with each step will not be described in detail.

Figure 8:
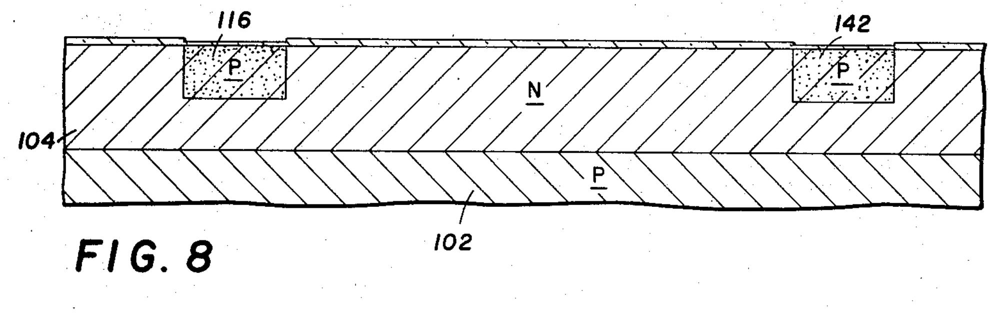
FIGS. 8–13 are schematic sectional views similar to FIG. 7 illustrating successive steps in the process for fabricating the monolithic circuit of FIG. 1.

The first step in the process is the deposition and partial diffusion of the impurities which will ultimately form tribromide ($BBr_3$) as the impurity source. The deposition the p-type collector region 116 of the PNP transistor 114 and the p-type region 142 of the capacitor 140. This diffusion is typically a standard boron diffusion using boron step is carried out at 950° C. and includes a five minute prepurge, a fifteen minute deposition period, and a five minute after-purge. The resulting sheet resistance is about sixty ohms per square. At this point, the impurities which will ultimately form diffused regions 116 and 142 have been introduced to the n-type layer 104. The substrate is then subjected to a 10% buffered etch deglaze step and placed in a diffusion furnace having a steam atmosphere and heated to about 1200° C. for about forty minutes, and to about 1250° C. for about thirty minutes, to partially diffuse the impurities. The substrate then appears somewhat as represented in FIG. 8.

Figure 9:
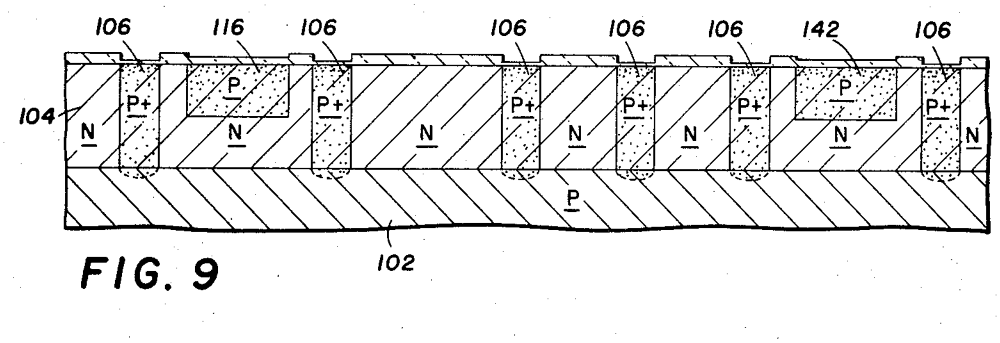

Next, a p-type deposition is made in the areas necessary to form the isolation rings 106 around each of the circuit components. The diffusion step is identical to that just described in connection with areas 116 and 142, except that the deposition is made at 1150° C. for thirty minutes and the diffusion step is carried out at 1250° C. for about six hours in a dry oxygen atmosphere rather than steam. The substrate then appears somewhat as represented in FIG. 9. It will be noted that the p-type collector region 116 has been diffused to a greater depth than in FIG. 8. In actuality, neither of the p-type diffused regions is at its final depth at this stage of the process, but both regions are approaching the final depths which are shown to simplify the illustration.

Figure 10:
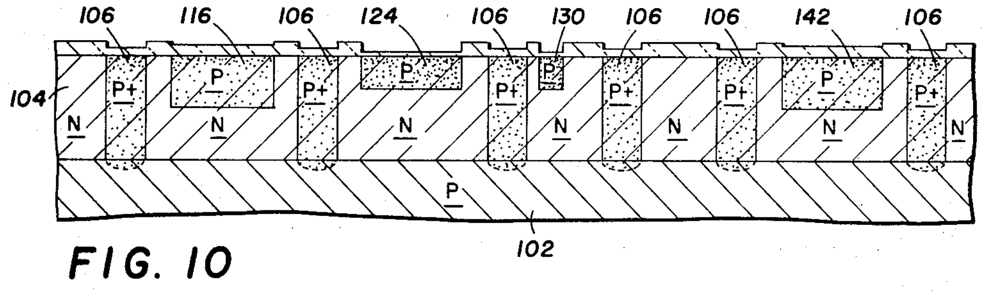

Since the NPN transistor 122 is deeper than the PNP transistor 114, the p-type base region 124 and the p-type anode region 130 of diode 128 are diffused next. This is again a boron diffusion which may be performed from boron tribromide ($BBr_3$). The deposition is made at 950° C. for a period of fifteen minutes and results in an initial sheet resistance of about sixty ohms per square. After a deglaze step, the substrate is then placed in a diffusion furnace and heated to 1200° C. in an oxygen atmosphere for five minutes, a steam atmosphere for twenty minutes, and a nitrogen atmosphere for five minutes. The resulting structure is represented in FIG. 10.

Figure 11:
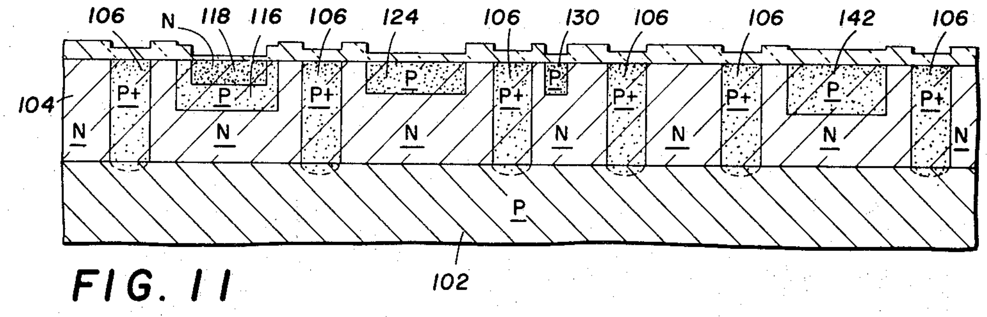

Next, the base region 118 of the PNP transistor 114 is diffused. Phosphorus oxytrichloride ($POCl_3$) may be used to supply phosphorus for doping the silicon. The deposition is made at 800° C. for about twenty minutes, preceded and followed by five minute nitrogen purges, to give a sheet resistance of about 200 ohms per square. After a deglaze step, the base region 118 is diffused at 1200° C. for five minutes in an oxygen atmosphere, twenty minutes in a steam atmosphere, and five minutes in a nitrogen atmosphere. The structure is then approximately as illustrated in FIG. 11.

Figure 12:
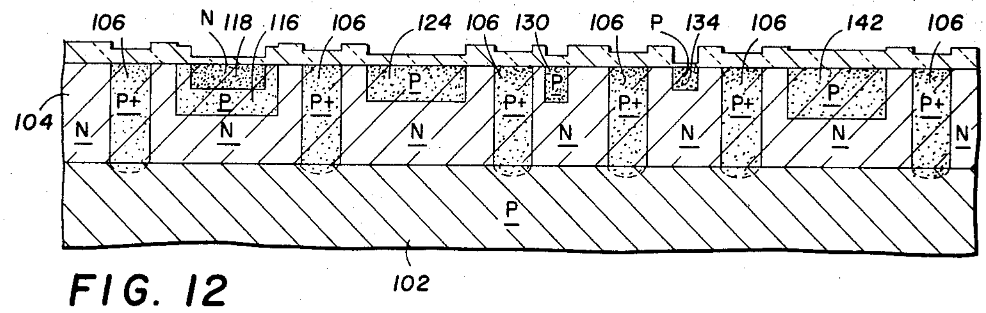

Next, the resistor 134 is diffused. Again boron tribromide ($BBr_3$) is used to provide boron as the p-type doping impurity. The deposition is made at 850° C. for fifteen minutes preceded and followed by five minute nitrogen purge cycles. The sheet resistance is about 200 ohms per square. After a deglaze step, the substrate is placed in a diffusion furnace and heated to 1200° C. for about twenty minutes in a steam atmosphere, preceded and followed by five minute oxygen and nitrogen cycles. The sheet resistance of the diffused resistor is then about 600 ohms per square. The structure is then approximately as illustrated in FIG. 12.

At this point, the diffusions are substantially at their final depths and final sheet resistances because the two subsequent emitter diffusions are at relatively low temperatures for relatively short periods of time, as will presently be described. The PNP transistor collector region 116 has a sheet resistance of about 150 ohms per square and a depth of about forty lines; the PNP transistor base region 118 has a sheet resistance of about 60 ohms per square and a depth of about five lines; the NPN transistor base region 124 has a sheet resistance of about 175 ohms per square, and a depth of about twelve lines; and the resistor diffusion 134 has a sheet resistance of about 500 ohms per square and a depth of about five lines.

Figure 13:
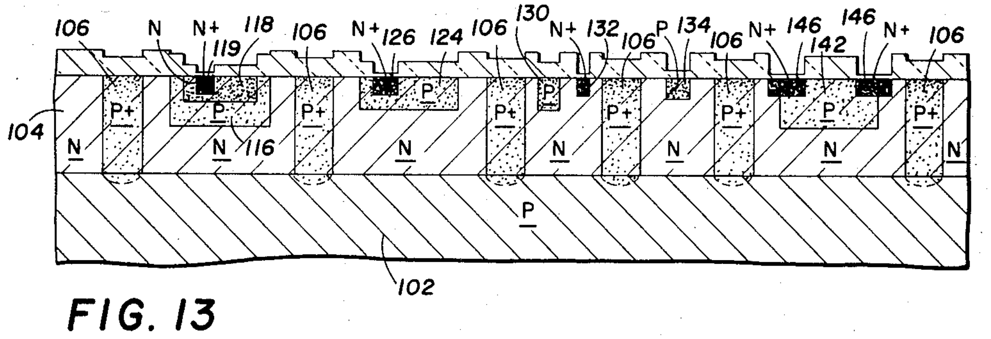

Finally, the NPN transistor emitter region 126, the base contact region 119, the cathode contact region 132 of the diode 128, and the diffused region 146 of the capacitor 140 are deposited and diffused from phosphorus oxytrichloride ($POCl_3$) at 1100° C. for twenty minutes, preceded and followed by a nitrogen purge. After this step, the structure appears substantially as shown in FIG. 13.

Then after a deglazing step, the PNP transistor emitter region 120, the NPN transistor base contact region 125, and the contact region 144 of the capacitor 140 are diffused using boron tribromide as the source of boron. The deposition and diffusion is carried out at 1100° C. for about seven minutes, preceded and followed by one minute nitrogen purges. The structure then appears as shown in FIG. 7.

The capacitor 140 also has a high Q value and relatively short time constant as a result of a low $R_s$ value. The low $R_s$ value is provided by the use of the PNP transistor collector diffusion to form the diffused region 142 and the use of the NPN transistor emitter diffusion to form diffused region 146. The p-type region resulting between the lower junction formed between diffused p-type region 142 and the n-tpye epitaxial region 120 and the upper junction formed between p-type region 142 and n-type diffused region 146 is much thicker than the base region of a transistor customarily used for the same purpose, and therefore has a much lower sheet resistance, even though the impurity concentration may also be slightly lower. The lower sheet resistance materially reduces the series resistance $R_s$ for a two-junction capacitor of the same area, thus substantially increasing the Q value of the capacitor.

Although preferred embodiments of the invention have been described in detail, it is to be understood that various changes, substitutions and alterations can be made therein without departing from the spirit and scope of the invention as defined by the appended claims.

What is claimed is:

1. In a process for fabricating a monolithic integrated circuit including a matched pair of complementary bipolar transistors and a double junction capacitor, essentially comprising the steps of:

(a) epitaxially, depositing a thin layer of semiconductor material of one conductivity type over substantially the entire area of one surface of a semiconductor substrate of opposite conductivity type, said epitaxial layer having a resistivity of about 0.2 ohm-centimeters and a thickness of about 18 microns, and said substrate has a resistivity of between 10–15 ohm-centimeters;

(b) concurrently diffusing first and second regions of said other conductivity type in said epitaxial layer, said first and second regions have a sheet resistance of about 150 ohms/square and a depth of about 40 lines;

(c) diffusing a plurality of isolation rings of said other conductivity type through said epitaxial layer to said substrate so as to form a plurality of electrically isolated pockets, with said first and second regions being respectively positioned within a first and second one of said pockets, said isolation rings being doped with boron and having a depth of about 11.5 microns;

(d) diffusing a third region of said other conductivity type in a third one of said pockets, said third region having a sheet resistance of about 175 ohms/square and a depth of about 12 lines;

(e) concurrently diffusing fourth and fifth regions of said one conductivity type respectively in said second and third regions, said fourth and fifth regions having a sheet resistance of less than 175 ohms/square and a depth of less than 12 lines;

(f) said first region is the collector region of one of said transistors and said third and fifth regions are respectively the base and emitter regions of the other of said transistors; and wherein (g) said second region and the contiguous portion of said epitaxial layer form the lower junction of said capacitor, and the contiguous portions of said second and fourth regions form the upper junction of said capacitor.

2. A method of making a monolithic integrated circuit including a matched pair of complementary bipolar transistors and a double junction capacitor, essentially comprising the steps of:

(a) epitaxially depositing a thin layer of semiconductor material of one conductivity type over substantially the entire area of one surface of a semiconductor substrate of opposite conductivity type, said epitaxial layer having a resistivity of about 0.2 ohm-centimeters and a depth of about 10 microns, and said substrate having resistivity between 10–15 ohm-centimeters and a thickness of about 0.010 inch;

(b) diffusing first and second regions of said other conductivity type in said epitaxial layer, said first and second regions being doped with boron and having a surface impurity concentration of about $2\times10^{18}$ atoms/cc. and a depth of about 8.5 microns;

(c) diffusing a plurality of isolation rings of said other conductivity type through said epitaxial layer to said substrate so as to form a plurality of electrically isolated pockets, with said first and second regions being respectively position within a first and second one of said pockets, said isolation rings being doped with boron and having a depth of about 11.5 microns;

(d) diffusing a third region of said other conductivity type in a third one of said pockets, said third region being doped with boron and having a surface impurity concentration of about $5\times10^{18}$ atoms/cc. and a depth of about 0.96 micron;

(e) diffusing a fourth region of said one conductivity type in said first region, said fourth region being doped with phosphorous and having a surface impurity concentration of about $1\times10^{19}$ atoms/cc. and a depth of about 1.6 microns;

(f) concurrently diffusing fifth and sixth regions of said other conductivity type respectively in said first and second regions, said fifth and sixth regions being doped with boron and having a surface impurity concentration of about $4\times10^{20}$ atoms/cc. and a depth of about 1.1 microns;

(g) concurrently diffusing seventh, eighth and ninth regions of said one conductivity type respectively in said third and fourth regions, said seventh and ninth regions being respectively spaced from said sixth and fifth regions, said seventh, eighth and ninth regions being doped with phosphorous and having a surface impurity concentration of about $1\times10^{21}$ atoms/cc. and a depth of about 0.5 micron;

(h) said first, fourth, fifth and ninth regions are respectively the collector, base, emitter, and base contact regions of one of said pair of complementary transistors; and wherein (i) said third and eighth regions are respectively the base and emitter regions of the other one of said pair of complementary transistors, whereby the portion of said epitaxial layer within said third pocket is the collector region of said other complementary transistor; and wherein (j) said second region and the epitaxial layer contiguous therewith form the lower junction of said capacitor, said second and seventh regions form the upper junction of said capacitor, and said sixth region is the contact region for said capacitor.

3. The monolithic integrated circuit of claim 2 wherein said one conductivity is N-type, said other conductivity is P-type and said first and second transistors are PNP and NPN transistors, respectively.

4. The monolithic integrated circuit of claim 2 and further including the step of diffusing first, second and third buried regions of said one conductivity type within said substrate so as to be respectively formed within said first, second and third pockets prior to the diffusion of said first and second regions, said first, second and third buried regions being doped with antimony and have a surface impurity concentration of about $1\times10^{18}$ atoms/cc. and a depth of about 10 microns.

5. The method of claim 2 and further including the forming of an electrically isolated diffused diode, essentially comprising the following steps:

(a) diffusing a tenth region of said opposite conductivity type within a fourth one of said pockets concurrently with the diffusion step of said third region, said tenth region having a surface impurity concentration of about $5\times10^{18}$ atoms/cc. and a depth of about 0.96 micron;

(b) diffusing an eleventh region of said one conductivity type within said fourth pocket spaced from said tenth region concurrently with the diffusion step of said seventh, eighth and ninth regions, said eleventh region having a surface impurity concentration of about $1\times10^{19}$ atoms/cc. and a depth of about 1.6 microns;

(c) said tenth and eleventh regions are respectively the anode and cathode contact regions of said diode, whereby the portion of said epitaxial layer within said fourth pocket is the cathode region of said diode.

6. The method of claim 2 and further including the forming of an electrically isolated diffused resistor essentially comprising the step of diffusing a tenth region of said other conductivity type within a fourth one of said pockets intermediate the diffusion steps of said fourth region and of said fifth and sixth regions, said tenth region being doped with boron and having a sheet resistance of about 600 ohms/square.

References Cited

UNITED STATES PATENTS

| | | | |
|---|---|---|---|
| 3,258,723 | 6/1966 | Osafune et al. | 317—235 X |
| 3,260,902 | 7/1966 | Porter | 317—235 |
| 3,327,182 | 6/1967 | Kisinko | 317—235 |
| 3,370,995 | 2/1968 | Lowery et al. | 148—175 |
| 3,380,153 | 4/1968 | Husher et al. | 29—577 |
| 3,414,783 | 12/1968 | Moore | 317—235 |
| 3,423,653 | 1/1969 | Chang | 317—235 |
| 3,436,282 | 4/1969 | Shoda | 148—187 |
| 3,441,815 | 4/1969 | Pollock et al. | 317—235 |
| 3,460,006 | 8/1969 | Strull | 148—175 X |
| 3,481,801 | 12/1969 | Hugle | 148—175 |

OTHER REFERENCES

Warner, R. M. et al.: "Integrated Circuits, Design Principles and Fabrication," McGraw-Hill Book Company, 1965, pp. 145–150 and 246–264.

L. DEWAYNE RUTLEDGE, Primary Examiner

W. G. SABA, Assistant Examiner

U.S. Cl. X.R.

29—577; 117—201, 212; 148—187, 188; 317—235 R